(12) United States Patent
Nomura et al.

(10) Patent No.: US 6,440,590 B1
(45) Date of Patent: Aug. 27, 2002

(54) BRAZING STRUCTURE AND METALLIZED STRUCTURE

(75) Inventors: Masahiro Nomura, Tokyo (JP); Chihiro Iwamoto, Tokyo (JP); Shun-Ichiro Tanaka, Kanagawa (JP)

(73) Assignees: Japan Science and Technology Corporation, Kawaguchi (JP); Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/508,855
(22) PCT Filed: Sep. 18, 1998
(86) PCT No.: PCT/JP98/04213
§ 371 (c)(1), (2), (4) Date: Mar. 17, 2000
(87) PCT Pub. No.: WO99/15478
PCT Pub. Date: Apr. 1, 1999

(30) Foreign Application Priority Data

Sep. 19, 1997 (JP) .............................. P9-255290

(51) Int. Cl.$^7$ ................................. B32B 9/00
(52) U.S. Cl. ................. 428/698; 428/699; 428/446; 428/457; 428/469; 428/704; 428/701; 428/702
(58) Field of Search ................. 428/704, 701, 428/702, 698, 699, 446, 457, 469

(56) References Cited

FOREIGN PATENT DOCUMENTS

| JP | 62-297275 | 12/1987 |
| JP | 63-190770 | 8/1988 |
| JP | 1-119570 | 5/1989 |
| JP | 3-205389 | 9/1991 |

OTHER PUBLICATIONS

Y. Shichi et al., "Study of Joining Interface Between $Si_3Ni_4$ and Metal by Active Metal", J. Ceram. Soc. Jpn, Inter. Ed., vol. 97, pp. 1354–1357, (1989).

H-K Lee et al., "Effects of the Relative Contents of silver and Copper on the Interfacial Reactions and Bond Strength in the Active Brazing of SIC", Journal of Materials Science, vol. 28, pp. 1765–1774, (1993).

Primary Examiner—Deborah Jones
Assistant Examiner—Wendy Boss
(74) Attorney, Agent, or Firm—Finnegan, Henderson, Farabow, Garrett & Dunner L.L.P.

(57) ABSTRACT

A structure comprising silicon-containing ceramic body and an active metal-containing metal layer as a brazing layer or a metallization layer bonded to and disposed on the surface of the ceramic body. A reaction layer of a compound containing constituent elements of the ceramic body and the active metal is formed in the interface between the ceramic body and the metal layer. The reaction layer is present ahead the outer circular edge of the metal layer. In particular, when the ceramic body is silicon nitride with the active metal being titanium, the reaction layer comprises a first reaction layer composed mainly of titanium nitride and a second reaction layer composed mainly of titanium silicide. The first reaction layer is present ahead the outer circular edge of the second reaction layer. According to the brazed structure and the metallized structure, the characteristics of the metal layer containing the active metal, such as bonding strength, can be improved with good reproducibility.

12 Claims, 4 Drawing Sheets

BRAZING STRUCTURE AND METALLIZED STRUCTURE

TECHNICAL FIELD

The present invention relates to a brazed structure and a metallized structure in which a substrate is ceramic material containing Si such as silicon nitride and a brazing layer or a metallization layer containing an active metal is bonded to and disposed on the ceramics.

BACKGROUND ART

Ceramic body such as silicon nitride, SIALON and silicon carbide has various kinds of characteristics not existing in material such as metals. Due to the above, these have been applied and developed as materials of various kinds of components. For instance, by making use of such characteristics as heat resistance, abrasion resistance and light weight and high mechanical strength, these have been applied in structural and mechanical components. However, ceramic material is inherently brittle. In order to complement such a disadvantage, the ceramic material is generally bonded to and integrated with metallic material to use.

In bonding together ceramics and metal, brazing material (active metal brazing material) containing an active metal such as, for instance, Ag—Cu—Ti alloy is used to form in advance an active metal-containing brazing layer on a ceramic body. An active metal-containing brazing layer, after disposing a laminate of respective metal foils, an alloy foil or alloy powder on a silicon nitride, is formed by heat-treatment at temperatures higher than the melting point of the active metal-containing brazing material.

On the other hand, the ceramic material such as silicon nitride, by making use of properties of high electrical insulation, high thermal conductance and high mechanical strength thereof, is applied in electronic components. In this case, with the purpose of forming interconnection layers and circuit networks, a metal layer (metallization layer) containing an active metal such as Ag—Cu—Ti alloy is formed on the surface of ceramic body (substrate). Such a metallization layer is formed as identical as the brazing layer is formed. When a metal plate such as copper plate is used for the interconnection layer, an active metal-containing metal layer is used for a brazing layer as well as structural material.

When an active metal-containing metal layer (brazing layer or metallization layer) is formed on a surface of a silicon nitride or the like, in the existing procedure, it is general to heat-treat under conditions. Under the conditions, active metal-containing brazing material or metallization material sufficiently wets and spreads on the surface of the silicon nitride.

However, under the existing condition of heat-treatment, there are cases where bonding strength of the brazing layer or metallization layer, further the mechanical strength after brazing become insufficient. This is due to the existing condition of heat-treatment being set to make small a contact angle (wetting angle) of a metal layer by paying attention to wettability of the metal layer to mainly silicon nitride or the like. According to experiments of the present inventors, it has been made clear that reactions between a ceramic material such as silicon nitride and a metal layer must be fully taken into consideration. Due to the lack of consideration to such points, the existing condition of heat-treatment tends to cause the decrease of bonding strength of the brazing layer or metallization layer.

Further, when an active metal-containing metal layer such as Ag—Cu—Ti alloy is formed on a silicon nitride through heat-treatment, it is known that the silicon nitride and the Ag—Cu—Ti alloy react to form reaction products such as TiN for instance at the interface thereof. However, it is not tried to control reaction products considering diffusion and wettability of the metal layer.

As described above, in the existing method of forming an active metal-containing metal layer (brazing layer or metallization layer), there are problems. These problems are that bonding strength between ceramic body containing silicon such as silicon nitride, SIALON and silicon carbide and a metal layer, further the strength after brazing when a metal layer being a brazing layer, may be insufficient. From the above, it is desired, without deteriorating diffusivity (wettability) of atoms in a metal layer to a ceramic body containing silicon, to improve the bonding strength or the like of the active metal-containing metal layer as brazing layer or metallization layer with reproducibility.

An object of the present invention is to provide a brazed structure and a metallized structure that enable to improve characteristics such as the bonding strength or the like of an active metal-containing metal layer with reproducibility.

DISCLOSURE OF INVENTION

A brazed structure of the present invention comprises a ceramic body containing silicon, an active metal-containing brazing layer, and a reaction layer. The active metal-containing brazing layer is bonded to and disposed on a surface of the ceramic body. The reaction layer is formed at the interface of the ceramic body and the brazing layer and consisting essentially of a compound containing constituent elements of the ceramics and the active metal. Here, the reaction layer exists ahead a front edge line of the brazing layer along a direction into which the brazing layer spreads while wetting.

A metallized structure of the present invention comprises ceramic body containing silicon, an active metal-containing metallization layer, and a reaction layer. The active metal-containing metallization layer is bonded to and disposed on a surface of the ceramic body. The reaction layer is formed at the interface between the ceramic body and the metallization layer and consisting essentially of a compound containing constituent elements of the ceramic body and the active metal. Here, the reaction layer exists ahead a front edge line of the metallization layer along a direction into which the metallization layer spreads while wetting.

In a brazed structure and a metallized structure of the present invention, in more specific, the reaction layer comprises a first reaction layer, and a second reaction layer. The first reaction layer exists more close to the ceramic body than to the brazing layer and consists mainly of a compound made of a non-metallic element of constituent of the ceramic body and an active metal. The second reaction layer exists more close to the brazing layer than to the ceramic body and consists mainly of a compound made of silicon of constituent elements of the ceramic body and an active metal. In the case of the reaction layer having such a structure, the first reaction layer exists ahead of a front edge line of the second reaction layer, or the first reaction layer is formed uniformly.

In a brazed structure and a metallized structure of the present invention, for the ceramic body, one kind selected from, for instance, silicon nitride, SIALON and silicon carbide can be used. In addition, as the active metal, at least one kind selected from, for instance, titanium, zirconium, hafnium, niobium, aluminum, vanadium and tantalum can be used.

In the present invention, a reaction layer consisting of compounds containing constituent elements of the silicon-containing ceramic body and an active metal exists ahead a front edge line of a metal layer as the brazing layer or the metallization layer. Thus, by allowing a reaction layer consisting of compounds that are reaction products of the ceramic body and an active metal to exist ahead in a direction into which the metal layer spreads while wetting (diffusing direction), the bonding strength of the metal layer can be improved with stability.

In particular, by advancing the first reaction layer ahead of the second reaction layer, the metal layer bonded with high strength can be realized with good reproducibility. The first reaction layer largely contributes in improvement of the bonding strength of the ceramic body and the metal layer and consists mainly of a compound of a nonmetallic element of the ceramic body and an active metal such as titanium nitride. The second reaction layer consists mainly of a compound of silicon and an active metal such as titanium silicide. Further, even by forming the first reaction layer uniform, the metal layer bonded with high mechanical strength can be obtained with good reproducibility. When the second reaction layer advances ahead of the first reaction layer, titanium nitride or the like that is a main component of the first reaction layer decreases in its amount. As a result of this, the first reaction layer is likely to be formed discretely to result in deterioration of the bonding strength.

EMBODIMENTS FOR CARRYING OUT THE INVENTION

In the following, embodiments for carrying out the present invention will be described.

Figure 1:
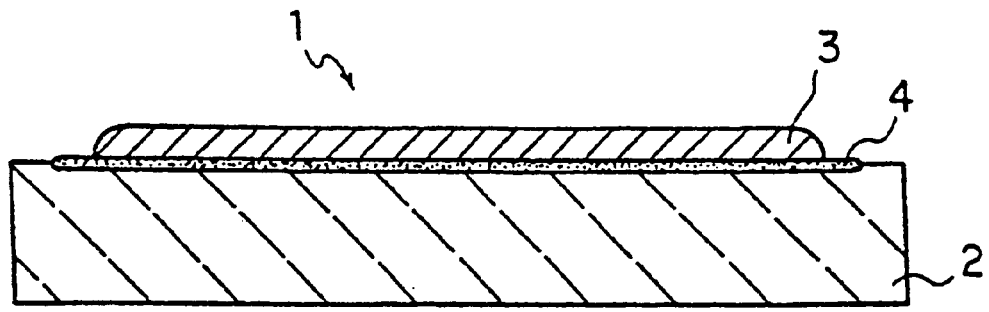
FIG. 1 is a cross-section showing schematically a bonded structure of ceramics and a metal layer as one embodiment of a brazed structure and a metallized structure of the present invention.

FIG. 1 is a cross-section showing schematically a bonded structure of a ceramics and a metal layer as one embodiment of a brazed structure and a metallized structure of the present invention. The bonded structure 1 of a ceramics and a metal layer shown in the figure has a structure in which a metal layer 3 is bonded to and disposed on a surface of ceramic material 2.

For the ceramic body 2, various kinds of ceramic body containing silicon (Si) as a main constituent element can be used. In specific, silicon nitride ($Si_3N_4$), SIALON (Si—Al—O—N), silicon carbide (SiC) or the like can be applied.

These ceramic bodies 2 are not particularly restricted in their compositions and manufacturing methods. The ceramic body containing Si of various kinds of compositions and manufacturing methods can be used. For instance, for the silicon nitride, ones that are produced by the use of various kinds of sintering methods with various kinds of metal oxides such as yttria, alumina, magnesia and so on or nitrides of metals as sintering aid can be used. The various kinds of sintering methods include pressureless sintering, gas-pressured sintering, hot pressing, reaction sintering and so on. In addition, ones treated by use of HIP or the like also can be used.

When a bonded structure 1 of ceramics/metal layer is used as a brazed structure, for the ceramic body 2, various kinds of sintered bodies for structural materials or electronic materials can be used. For the ceramics for structural material, mainly, silicon nitride, SIALON and silicon carbide of which mechanical strength, hardness and toughness are improved can be preferably used.

Further, when a bonded structure 1 of ceramics/metal layer is used as a metallized structure, for the ceramic body 2, silicon nitride substrate, SIALON substrate, silicon carbide substrate or the like for electronic use can be used. For the silicon nitride substrate for electronic use, silicon nitride substrate of which thermal conductivity and insulation are considered of importance can be used. In addition, a silicon carbide substrate that functions as a semiconductor substrate can be also used.

On the ceramic body 2, a metal layer (hereinafter refers to as active metal containing metal layer) 3 containing an active metal is formed as an active metal brazing layer or metallization layer. For the active metal containing metal layer 3, metal layer forming material to which active metals such as, for instance, Ti, Zr, Hf, Nb, Al, V, Ta or the like are added can be used. As the base material of the metal layer forming material, Ag—Cu alloy, Cu or the like can be cited.

The active metals as described above are preferable to be contained in the metal layer forming material in the range of approximately 1 to 10% by weight. When the content of the active metal is less than 1% by weight, the amount of formation of a compound as a reaction layer that will be described later in detail becomes insufficient. As a result of this, the bonding strength with the ceramic body 2 containing Si can not be sufficiently high. on the other hand, when the content of the active metal exceeds 10% by weight, the amount of compound layer increases so much to cause a likelihood of deteriorating the bonding strength.

Among these, particularly Ag—Cu—Ti alloy containing Ti as an active metal can be preferably used. The Ag—Cu—Ti alloy has an excellent function for either of a brazing layer and a metallization layer. In addition, Ti as the active metal, being excellent in reactivity in particular with silicon nitride and SIALON, largely contributes in improving the bonding strength of the ceramic body 2 and the active metal containing metal layer 3.

The active metal containing metal layer 3 can be formed in the following way. First, an alloy foil or alloy powder containing principal formation material of the metal layer and active metal, or a laminate of the respective metal foils is disposed on the ceramic body with a desired shape. Thereafter, at temperatures of melting point of the employed active metal containing metallic material or more, heat-treatment is carried out to form the active metal containing metal layer 3. During such heat-treatment, the active metal containing metallic material is melted to diffuse along the surface of the ceramic body 2 (spread while wetting).

As the wetting of the active metal containing metallic material proceeds, the active metal diffuses and begins to react with the ceramic body 2 containing Si. As a result, at the interface of the ceramic body 2 and active metal containing metal layer 3, a reaction layer 4 consisting of compounds containing the constituent elements of the ceramic body 2 and the active metal is formed. At this time, the heat-treatment is carried out under the following condition. The condition is that relative to a direction (wetting and spreading direction: shown with an arrow mark in FIG. 2) in which the active metal containing metal layer 3 diffuses, a compound layer as a reaction layer 4 advances ahead of the front edge line of the active metal containing metal layer 3.

That is, the reaction between the ceramics 2 and active metal is made to advance in a direction of the surface of the ceramic body 2 than the front edge line of the active metal containing metal layer 3. In other words, the reaction products containing the constituent elements of the ceramic body 2 and the active metal are grown in the direction of the surface. Then, on the reaction layer 4 consisting of compounds formed based on the reaction and growth, the active metal containing metal layer 3 is made to diffuse.

Thereby, finally, as shown in FIG. 1, the reaction layer 4 consisting of compounds that contain the constituent elements of the ceramic body 2 and the active metal is formed in a state of advancing ahead the front edge line of the active metal containing metal layer 3. By controlling the reaction of the ceramic body 2 and active metal, the aforementioned state can be obtained.

As mentioned above, the reaction layer 4 consisting of compounds containing the constituent elements of the ceramic body 2 and the active metal is advanced ahead of the front edge line of the active metal containing metal layer 3. Thereby, there always exists a reaction layer between the ceramic body 2 and active metal containing metal layer 3. Further the amount of formation and state of formation of the compounds as the reaction products can be stabilized.

The bonding state of the edge of the active metal containing metal layer 3 and the ceramic body 2 particularly affects on the bonding strength of the ceramic body 2 and the active metal containing metal layer 3. Accordingly, the reaction layer 4 is made to advance ahead of the front edge line of the active metal containing metal layer 3 to stabilize the state of the compounds as the reaction products between the edge of the active metal containing metal layer 3 and the ceramic body 2. Thereby, the active metal containing metal layer 3 can be prevented from peeling off the edge thereof. Therewith, the bonding strength of the ceramic body 2 and the active metal containing metal layer 3 can be increased with good reproducibility.

In an existing bonded body of ceramics/metal layer, an active metal and ceramic body is made to react only at the interface of the ceramics and the active metal containing metal layer. In that case, the microstructure of the reaction layer is likely to fluctuate particularly at the edge of the metal layer. On the contrary, by advancing the compound layer as the reaction layer 4 ahead of the front edge line of the active metal containing metal layer 3, the bonding state of the active metal containing metal layer 3, in particular of the edge thereof can be stabilized with good reproducibility.

In other words, so far a triple point of ceramic body/active metal containing metal layer/atmosphere is a starting point of reaction. On the other hand, in the present invention, the neighborhood of the edge of the active metal containing metal layer 3 is constituted of a triple point and the reaction layer 4 of a thickness of several tens nm preceding thereof.

Here, the triple point is constituted of active metal containing metal layer 3/reaction layer 4 (compound layer)/atmosphere. Thereby, the neighborhood of the edge of the active metal containing metal layer 3 is made to stabilize. Accordingly, the bonding strength between the ceramic body 2 and active metal containing metal layer 3 can be increased with good reproducibility.

Next, the compound layer as reaction layer 4 will be described in detail. By the way, in the following, silicon nitride is used as the ceramic body 2 and Ti is used as the active metal.

Figure 2:
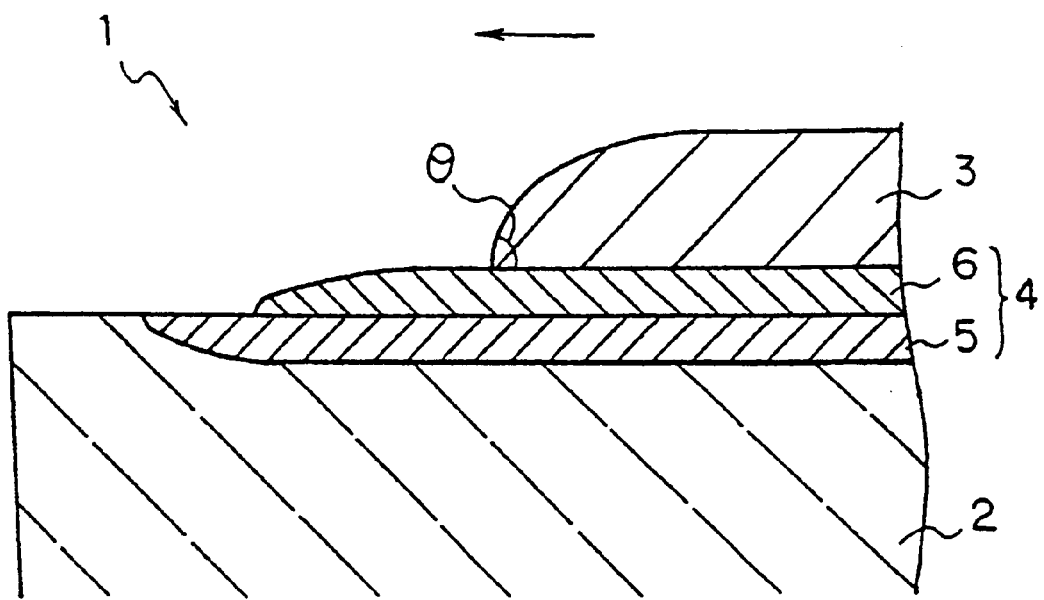
FIG. 2 is an enlarged cross-section showing an essential portion of a bonded structure of the ceramics and metal layer shown in FIG. 1.

In such a case, as shown in FIG. 2, on the side closer to the silicon nitride 2, a first reaction layer 5 containing titanium nitride (TiN) as a principal component is formed. And, on the side closer to the active metal containing metal layer 3 a second reaction layer 6 containing titanium silicide (for example $Ti_5Si_3$) as a principal component is formed. Thus, at the interface of the silicon nitride 2 and the active metal containing metal layer 3, a compound layer of two-layered structure (reaction layer 4) is formed. The compound layer is formed based on the reaction of Si and N that are constituent elements of the silicon nitride 2 and an active metal.

When the activity of Ti atoms that spreads through, for instance, surface diffusion from the active metal containing metal layer 3 is high, titanium nitride is preferably formed. Accordingly, at the silicon nitride 2 side that is a reaction point, a first reaction layer 5 containing titanium nitride as a principal component is formed. On the other hand, on the active metal containing metal layer 3 side, a second reaction layer 6 containing titanium silicide that is a stable phase as a principal component is formed. Among these reaction products, titanium nitride, compared with titanium silicide, contributes more largely in improving the bonding strength between the silicon nitride 2 and the active metal containing metal layer 3.

Accordingly, in a bonded structure 1 of silicon nitride/metal layer having a reaction layer 4 of two-layer structure, as shown in FIG. 2, a first reaction layer 5 of which principal component is titanium nitride is preferable to advance ahead of a second reaction layer 6 of which principal component is titanium silicide. In other words, the first reaction layer 5 of which principal component is titanium nitride is preferable to be formed in a larger amount.

Figure 3:
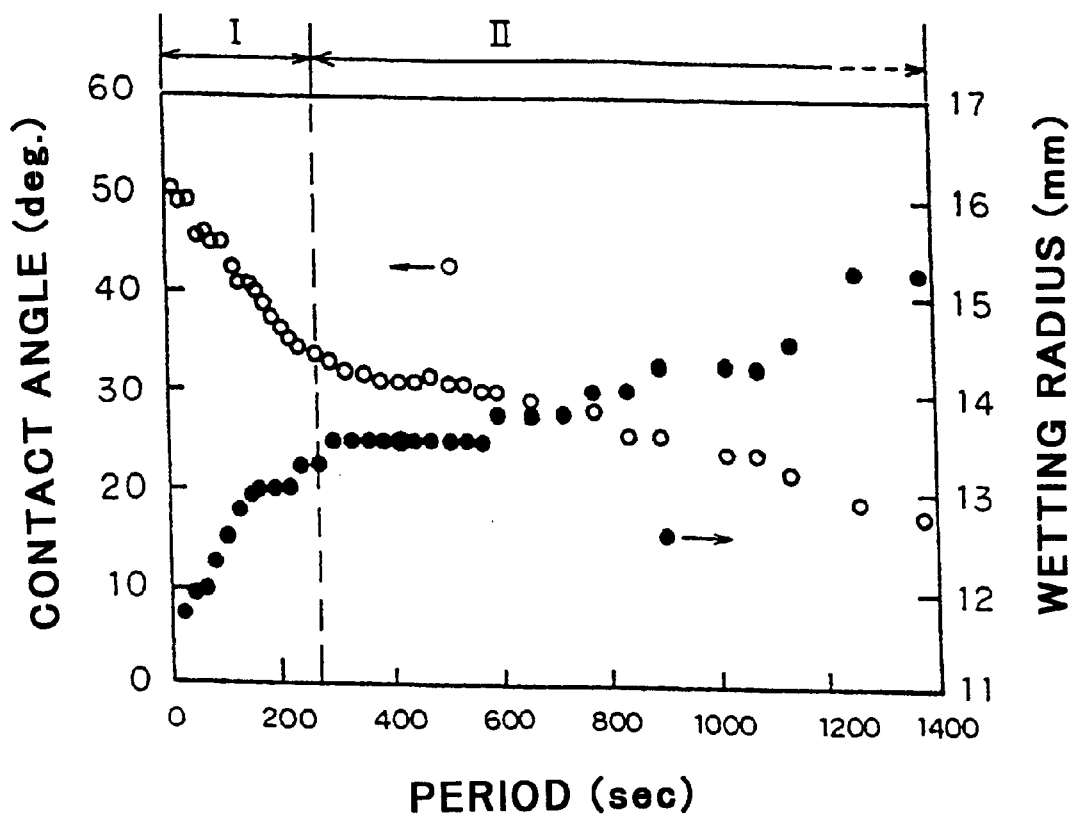
FIG. 3 is a diagram showing a change with time of contact angle and wetting radius of molten Ag—Cu—Ti alloy layer to silicon nitride.

The state in which the first reaction layer 5 advances ahead of the second reaction layer 6 can be obtained by controlling the heat-treatment period of the metal layer forming material containing Ti. FIG. 3 shows a change with time of the contact angle of the Ti containing metal layer (in specific, Ag—Cu—Ti alloy) 3 with the silicon nitride 2 and a radius (wetting radius) in a spreading direction while wetting. As obvious from FIG. 3, the increase rate (that is, diffusion rate) of the wetting radius is high in the first stage (I) of, for instance, approximately 250 sec or less from the start of wetting, and decreases drastically thereafter in the second stage (II). On the other hand, the contact angle, while decreasing drastically in the first stage (I), still continues to decrease in the second stage (II).

Of the respective stages (I) and (II) of the heat-treatment like this, in the first stage (I) where the wetting radius of the Ti containing metal layer 3 increases drastically, large amount of Ti atoms diffuses from the Ti containing metal layer 3 at the position preceding the front edge line of the Ti containing metal layer 3 in the wetting direction of the Ti containing metal layer 3. That is, the activity of Ti diffusing thereto through surface diffusion is high and titanium nitride is formed in sufficient amount due to the reaction of Ti and the silicon nitride 2. In addition, the titanium nitride is uniformly formed.

By stopping the heat-treatment at such first stage (I) the state in which the first reaction layer 5 advances ahead of the second reaction layer 6 can be obtained. Even if the heat-treatment is finished at the first stage (I), as mentioned above, since the Ti containing metal layer 3 diffuses (spreads while wetting) sufficiently in the first stage (I), defect due to insufficiently formed area of the Ti containing metal layer 3 is never caused.

Figure 4:
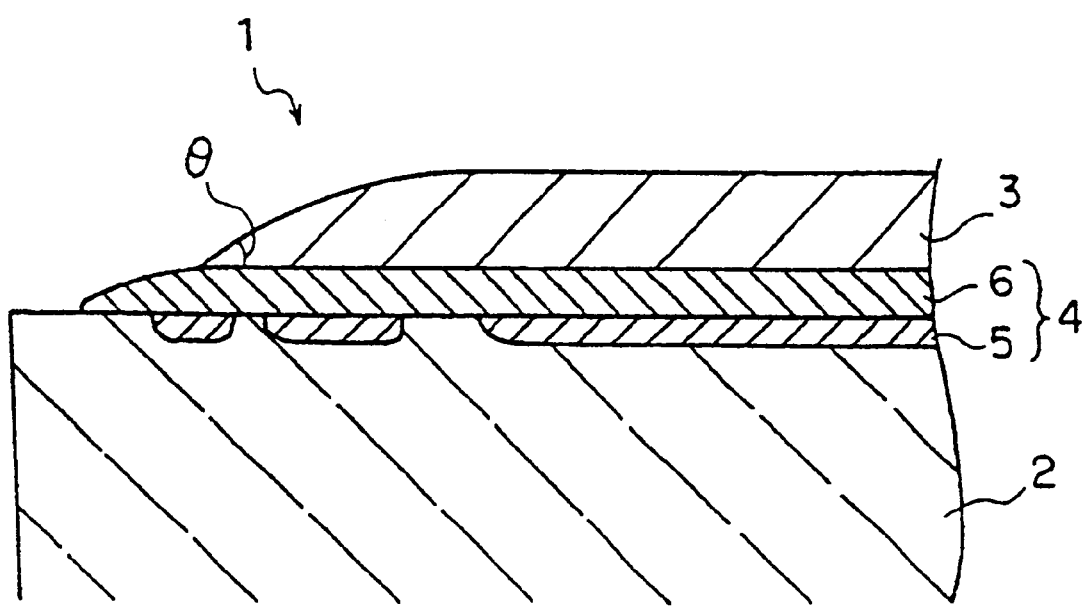
FIG. 4 is a cross-section showing an interface structure formed based on another heat-treatment process of a bonded structure of the ceramic and metal layer illustrated in FIG. 1.

On the other hand, after the first stage (I) when the heat-treatment is further continued to enter into the second stage (II), the contact angle (wetting angle) of the Ti containing metal layer 3 becomes smaller than that of after the first stage (I). However, as the wetting proceeds (proceeding of reaction), Ti atoms in the melt is consumed to decrease the activity of Ti. As a result, titanium silicide is likely to form. That is, as shown in FIG. 4, the second reaction layer 6 of which principal component is titanium silicide goes ahead of the first reaction layer 5.

As titanium silicide is formed, titanium nitride becomes difficult to grow and the first reaction layer becomes discrete. It is understood from a viewpoint of the thermodynamics that as the activity of Ti decreases, the stable phase converts from titanium nitride (TiN) to titanium silicide (for instance $Ti_5Si_3$). The activity of Ti decreases as the wetting period increases and the preceding layer switches from the first reaction layer 5 of which principal component is titanium nitride to the second reaction layer 6 of which principal component is titanium silicide.

As mentioned above, by advancing the first reaction layer 5 ahead of the second reaction layer 6, due to titanium nitride, an improvement of the bonding strength between the silicon nitride 2 and the Ti containing metal layer 3 can be obtained with more stability. In other words, the first reaction layer 5 of which principal component is titanium nitride is formed in a larger quantity and the titanium nitride is formed uniformly. Thereby, the improvement of the bonding strength between the silicon nitride 2 and the Ti containing metallic layer 3 can be realized with more stability. In such a structure of reaction layer, the bonding strength between the silicon nitride 2 and the Ti containing metal layer 3 can be increased further and the reproducibility of such bonding strength can be remarkably improved. In addition, the consumption of Ti atoms necessary for bonding in the later process can be suppressed.

In the explanation of morphology of the aforementioned compound layer 4 of two-layered structure, Ti is taken as an active metal for explanation. However, even when other active metals are used, the first reaction layer can be advanced ahead of the second reaction layer. Even in such a case, by advancing a reaction layer mainly containing a reaction product having high activity ahead of the other reaction layer, the bonding strength of a silicon nitride 2 and an active metal containing metal layer 3 can be further increased.

In addition, also when another ceramics than the silicon nitride, for instance, SIALON or silicon carbide is used as ceramic body 2, the same can be said. When SIALON is used as the ceramic body 2, the reactions approximately identical with the case of silicon nitride can be expected. When silicon carbide is used as the ceramic body 2, a first reaction layer is formed on the side closer to the substrate and a second reaction layer is formed on the side closer to the metal layer. Here, the principal components of the first reaction layer and second reaction layer are titanium carbide (TiC) and titanium silicide ($Ti_5Si_3$), respectively. The reaction layer of which principal component is titanium carbide, though formed in a smaller quantity than titanium nitride, behaves approximately identical with titanium nitride.

As mentioned above, the reaction layer 4 formed at the interface of the ceramic body 2 containing Si and the active metal containing metal layer 3 comprises a first reaction layer 5 and a second reaction layer 6. Here, the first reaction layer 5 comprises a compound of a non-metallic element (N or C) of constituent elements of the ceramic body 2 and an active metal as the principal component. The second reaction layer 6 comprises a compound of Si among constituent elements of the ceramic body and an active metal as the principal component.

When having such a structure of reaction layer, the first reaction layer 5 can be made to advance ahead the front edge line of the second reaction layer 6 along a direction in which the active metal containing metal layer 3 spreads while wetting. Thereby, the bonding strength between the ceramic body 2 and the active metal containing metal layer 3 can be further increased, and such bonding strength can be remarkably improved in reproducibility thereof. Further, by forming the first reaction layer uniformly, similarly, the bonding strength and reproducibility thereof can be increased remarkably.

When a bonded structure 1 of ceramics/metal layer of this embodiment is used as a brazed structure, the bonding strength of the active metal containing metal layer 3 as a layer of active metal brazing material to the ceramic body 2 can be increased with good reproducibility. Accordingly, not only reliability of the active metal containing brazing layer but also the strength and reliability of a bonded body that is produced in the later brazing process can be remarkably improved. Further, when the bonded structure 1 of ceramic body/metal layer is used as a metallized structure, reliability of the metallization layer as interconnection layer, electrode and parts mounting portion can be remarkably improved.

Next, specific embodiments of the present invention and results thereof will be described.

Embodiments 1 and 2

First, on a silicon nitride an alloy of a composition of 67.7% by weight of Ag-27.4% by weight of Cu-4.9% by weight of Ti is disposed to melt by heating in a vacuum lower than $10^{-3}$ Pa. The heating is carried out at temperatures of the melting point of this alloy that is 1183 K or more. Samples for observation are prepared by cooling after holding 60 sec (Embodiment 1) and 900 sec (Embodiment 2) from the start of wetting, respectively.

The triple points of these samples are observed from the surface with a secondary ion microscope (SIM) and the cross-sectional structure around the triple point is observed with a transmission electron microscope with a cold emission gun (FE-TEM). In addition, the compositions of the respective layers are analyzed by use of an energy dispersive X-ray spectroscopy (EDS) method. Further, in order to compare the change of the existing macroscopic wetting behavior and the change of the composition of the triple point, the change of the contact angle and wetting radius of Ag—Cu—Ti alloy with time is also measured. The measurement results are shown in FIG. 3.

First, by SIM, it is confirmed that a reaction layer forms ahead of the triple point of metal/substrate/gaseous phase. These preceding layers are observed in the respective samples of embodiments 1 and 2. Though the triple line of metal/substrate/gas phases have wavy forms microscopically, the front line of the preceding layer is almost straight. On the basis of the morphology of these lines, the preceding layers are not considered to form due to the contraction of metal in the course of cooling. But these are considered to form due to the growth in a lateral direction of a reaction product during wetting process overrunning the triple line of metal/substrate/gas phases. The contraction of metals is an isotropic phenomenon. Accordingly, such wavy triple lines are not formed. In addition, from their morphology, the reaction layer is considered to be very thin.

Figure 5:
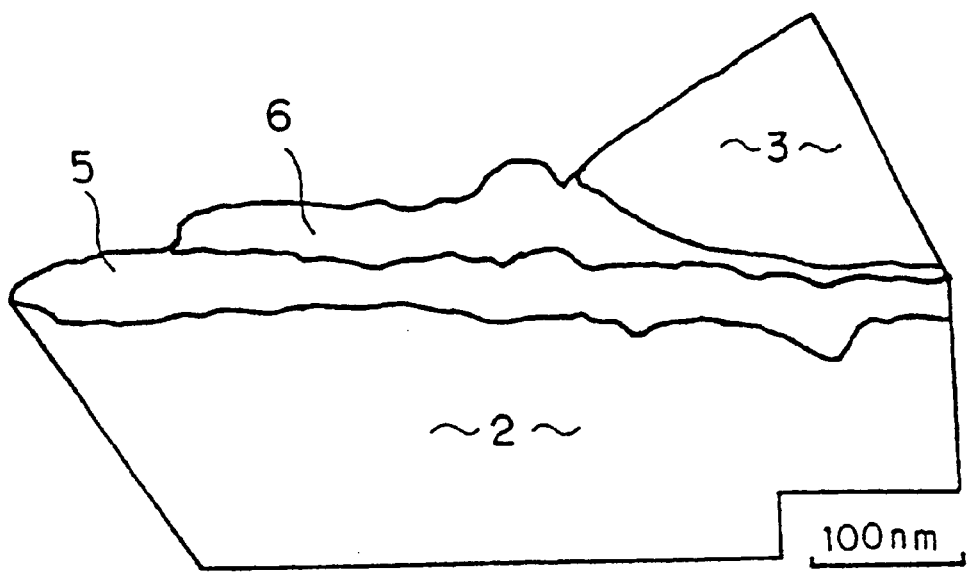
FIG. 5 is a diagram showing schematically an observed result of a cross-section of a bonded structure of silicon nitride/metal layer according to Embodiment 1 of the present invention.
Figure 6:
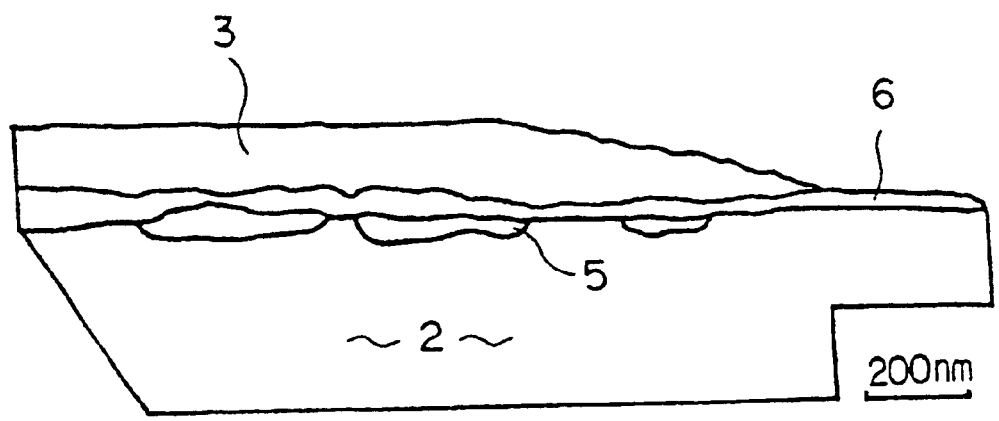
FIG. 6 is a diagram showing schematically an observed result of a cross-section of a bonded structure of silicon nitride/metal layer according to Embodiment 2 of the present invention.

FIG. 5 shows schematically an observed result (TEM photograph) of a cross-section around the triple point of a sample according to Embodiment 1. FIG. 6 shows schematically an observed result (TEM photograph) of a cross-section around the triple point of a sample according to Embodiment 2. As shown in FIGS. 5 and 6, it is observed that the reaction layers (compound layers) of the respective samples go ahead of the triple point, that is, the front edge line of the active metal containing metal layer. By realizing such states, the bonding strength of the metal layer and the bonding strength after brazing can be increased.

Further, in FIGS. 5 and 6, in both samples, at the interface of $Si_3N_4$ and the metal layer, a reaction layer of two-layered structure is found to form. From the element and mass analysis using EDS, the upper and the lower layers are confirmed to be a $Ti_5Si_3$ layer 6 and TiN layer 5, respectively. The TiN layer 5 is composed of nano-particles of TiN. However, whereas in embodiment 1 where the heat-treatment period is set shorter, the TiN layer 5 goes ahead the $Ti_5Si_3$ layer 6, in embodiment 2 where the heat-treatment period is set longer, on the contrary, it is found that $Ti_5Si_3$ layer 6 advances ahead of TiN layer 5.

As obvious from FIG. 3, as the wetting period becomes longer, the $Ti_5Si_3$ layer 6 advances more preferentially. This is considered that as the wetting proceeds, Ti in the melt is consumed to cause decrease of the activity of Ti. As the activity of Ti decreases, it is considered that the stable phase converts from TiN to $Ti_5Si_3$. The activity of Ti decreases as the increase of the wetting period and the preceding layer converts from TiN to $Ti_5Si_3$.

The bonding strength between $Si_3N_4$ and the metal layer is larger in embodiment 1 where TiN layer 5 is formed uniformly and TiN layer 5 goes ahead of $Ti_5Si_3$ layer 6. Further, the sample of embodiment 1, being suppressed in consumption of Ti atoms necessary for bonding of the later process for example, can further heighten the brazing strength. When the metal layer is a metallization layer, the similar effects can be expected.

INDUSTRIAL APPLICABILITY

A brazed structure of the present invention largely enhances not only reliability of an active metal containing brazing layer but also strength and reliability of a bonded body to be fabricated in the later brazing process. Accordingly, it is useful upon manufacturing various kinds of bonded bodies. In addition, a metallized structure of the present invention largely enhances reliability of a metallization layer to be used as for instance interconnections or circuit networks. Accordingly, it is useful for production of various kinds of electronic devices.

What is claimed is:

1. A brazed structure, comprising:

a ceramic body containing silicon;

a brazing layer containing an active metal bonded to and disposed on a surface of the ceramic body; and a reaction layer consisting essentially of a compound containing a constituent element of the ceramic body and the active metal formed at an interface of the ceramic body and the brazing layer, the reaction layer comprising a first reaction layer containing a compound of a non-metallic element of the constituent elements of the ceramic body and the active metal as a principal component and existing on a side closer to the ceramic body than to the brazing layer, and a second reaction layer containing a compound of the silicon of the constituent elements of the ceramic body and the active metal as a principal component and existing on a side closer to the brazing layer than to the ceramic body;

wherein the reaction layer exists ahead of a front edge line of the brazing layer along a direction in which the brazing layer spreads while wetting, and the first reaction layer exists ahead of a front edge line of the second reaction layer along the direction.

2. The brazed structure as set forth in claim 1:

wherein the ceramic body is one kind selected from silicon nitride, SIALON and silicon carbide.

3. The brazed structure as set forth in claim 1:

wherein the active metal is at least one kind selected from Ti, Zr, Hf, Nb, Al, V and Ta.

4. The brazed structure as set forth in claim 1:

wherein the first reaction layer is uniformly formed.

5. The brazed structure as set forth in claim 1:

wherein the ceramic body is silicon nitride, and the active metal is titanium.

6. The brazed structure as set forth in claim 5:

wherein the first reaction layer contains titanium nitride as a principal component, and the second reaction layer contains titanium silicide as a principal component.

7. A metallized structure, comprising:

a ceramic body containing silicon;

a metallization layer containing an active metal bonded to and disposed on a surface of the ceramic body; and a reaction layer consisting essentially of a compound containing a constituent element of the ceramic body and the active metal formed at an interface of the ceramic body and the metallization layer, the reaction layer comprising a first reaction layer containing a compound of a non-metallic element of the constituent elements of the ceramic body and the active metal as a principal component and existing on a side closer to the ceramic body than to the metallization layer, and a second reaction layer containing a compound of the silicon of the constituent elements of the ceramic body and the active metal as a principal component and existing on a side closer to the brazing layer than to the ceramic body;

wherein the reaction layer exists ahead of a front edge line of the metallization layer along a direction in which the metallization layer spreads while wetting, and the first reaction layer exists ahead of a front edge line of the second reaction layer along the direction.

8. The metallized structure as set forth in claim 7:

wherein the ceramic body is one kind selected from silicon nitride, SIALON and silicon carbide.

9. The metallized structure as set forth in claim 7:

wherein the active metal is at least one kind selected from Ti, Zr, Hf, Nb, Al, V and Ta.

10. The metallized structure as set forth in claim 7:

wherein the first reaction layer is uniformly formed.

11. The metallized structure as set forth in claim 7:

wherein the ceramic body is silicon nitride and the active metal is titanium.

12. The metallized structure as set forth in claim 11:

wherein the first reaction layer contains titanium nitride as a principal component, and the second reaction layer contains titanium silicide as a principle component.

* * * * *

UNITED STATES PATENT AND TRADEMARK OFFICE
CERTIFICATE OF CORRECTION

PATENT NO.    : 6,440,590 B1
DATED         : August 27, 2002
INVENTOR(S)   : Nomura et al.

It is certified that error appears in the above-identified patent and that said Letters Patent is hereby corrected as shown below:

Title page,
Item [75], Inventors, change "Shun-Ichiro" to -- Shun-ichiro --.
Item [74], *Attorney, Agent, or Firm,* change "Dunner" to -- Dunner, --.

Column 10,
Line 65, change "principle" to -- principal --.

Signed and Sealed this

Eighteenth Day of February, 2003

JAMES E. ROGAN
*Director of the United States Patent and Trademark Office*